United States Patent
Chen (10) Patent No.: US 10,065,240 B2
(45) Date of Patent: Sep. 4, 2018

(54) METAL POWDER FOR 3D PRINTERS AND PREPARATION METHOD FOR METAL POWDER

(71) Applicant: NINGBO GUANGBO NEW NANOMATERIALS STOCK CO., LTD., Ningbo (CN)

(72) Inventor: Gangqiang Chen, Toronto (CA)

(73) Assignee: NINGBO GUANGBO NEW NANOMATERIALS STOCK CO., LTD., Ningbo (CN)

( * ) Notice: Subject to any disclaimer, the term of this patent is extended or adjusted under 35 U.S.C. 154(b) by 174 days.

(21) Appl. No.: 15/113,055

(22) PCT Filed: Apr. 3, 2014

(86) PCT No.: PCT/CN2014/074722
§ 371 (c)(1),
(2) Date: Jul. 21, 2016

(87) PCT Pub. No.: WO2015/109658
PCT Pub. Date: Jul. 30, 2015

(65) Prior Publication Data
US 2017/0008082 A1    Jan. 12, 2017

(30) Foreign Application Priority Data
Jan. 22, 2014 (CN) .......................... 2014 1 0028642

(51) Int. Cl.
| | | |
|---|---|---|
| *B22F 9/02* | (2006.01) | |
| *B22F 9/08* | (2006.01) | |
| *B22F 1/00* | (2006.01) | |
| *C23C 14/14* | (2006.01) | |
| *C23C 14/58* | (2006.01) | |
| *C23C 16/06* | (2006.01) | |
| *C23C 16/56* | (2006.01) | |
| *B22F 3/105* | (2006.01) | |
| *B33Y 70/00* | (2015.01) | |

(52) U.S. Cl.
CPC .......... *B22F 1/0014* (2013.01); *B22F 1/007* (2013.01); *B22F 1/0011* (2013.01); *B22F 1/0062* (2013.01); *B22F 1/0096* (2013.01); *B22F 9/082* (2013.01); *C23C 14/14* (2013.01); *C23C 14/5873* (2013.01); *C23C 16/06* (2013.01); *C23C 16/56* (2013.01); *B22F 3/1055* (2013.01); *B22F 2009/084* (2013.01); *B22F 2301/15* (2013.01); *B22F 2302/45* (2013.01); *B22F 2304/05* (2013.01); *B22F 2304/10* (2013.01); *B22F 2998/10* (2013.01); *B33Y 70/00* (2014.12); *Y02P 10/295* (2015.11)

(58) Field of Classification Search
CPC ...... B33Y 70/00; Y02P 10/295; B22F 1/0014; B22F 1/0011; B22F 1/0062; B22F 1/0096; B22F 31/055; B22F 9/082; B22F 2301/15

See application file for complete search history.

(56) References Cited

U.S. PATENT DOCUMENTS

| | | | |
|---|---|---|---|
| 5,328,763 A | 7/1994 | Terry | |
| 2008/0317794 A1* | 12/2008 | Gellermann | ........... A61K 8/025 424/401 |
| 2016/0104580 A1* | 4/2016 | Maeshima | ........... H01G 9/0029 75/245 |

FOREIGN PATENT DOCUMENTS

| | | |
|---|---|---|
| CN | 1398990 A | 2/2003 |
| CN | 101884892 A | 11/2010 |
| CN | 102218533 A | 10/2011 |
| JP | 06184609 A | 7/1994 |
| WO | WO2012169255 A1 | 12/2012 |
| WO | WO 2014/199480 | * 12/2014 |

* cited by examiner

Primary Examiner — C Melissa Koslow
(74) Attorney, Agent, or Firm — Gokalp Bayramoglu (57) ABSTRACT

The invention discloses metal powder for a 3D printer. The metal powder for 3D printers is 10-50-micron metal powder made by agglomerating many submicron order metal particles through a granulating process. As the metal powder is combined by submicron order metal particles, the metal powder is low in melting point and high in melting speed, so that the printing speed of the metal 3D printer can be increased and the precision of a printing member can be improved. Meanwhile, the average grain size of the metal powder is equivalent to existing atomized metal powder for 3D printers, and the metal powder has good dispersibility and conveying property, and can be suitable for existing 3D printer equipment.

7 Claims, 6 Drawing Sheets

METAL POWDER FOR 3D PRINTERS AND PREPARATION METHOD FOR METAL POWDER

TECHNICAL FIELD

The invention relates to the technical field of raw materials used in 3D printers, particularly metal powder for 3D printers and a preparation method for the metal powder. The metal powder is metal powder, with the average grain size of 10-50 microns, formed by many submicron order metal particles.

BACKGROUND TECHNOLOGY 3D printing technology has already become one of the most concerned emerging technologies in the world at present. The novel production mode, together with other digitizing production modes, will work together to trigger the third industrial revolution. One of the bottlenecks restricting rapid development of 3D printing technology is printing materials, particularly metal printing materials. Research and development and production of metal materials which are better in performance and higher in universality are the key to enhancing 3D printing technology. In view of the fact that a high performance metal implement can be directly manufactured by means of 3D printing technology, various metal powders which are small in grain size, uniform in grain size, high in their degree of sphericity and low in oxygen content are required. At present, to procure high-end metal powder, China mainly relies on imports. Nevertheless, manufacturers abroad usually set raw materials and equipment at a high price, which greatly restricts the development of metal 3D printing technology in China.

Preparation methods for the metal powder mainly comprise an atomization method, a rotation electrode method etc. The metal powder prepared by means of the atomization method has the characteristics of having a high degree of sphericity, homogeneous component, low oxygen content and the like and is widely applied. The average grain size of the metal powder, which is limited, prepared by the atomization method is 10-50 microns, and the fine powder yield is low. At present, the submicron order metal powder cannot be prepared by means of the atomization method. Generally, the smaller the grain size of the metal powder, the higher the melting speed. The printing speed and precision can be improved. When the grain size of the metal powder reaches the submicron order (the particle diameter is 100 nm to 1.0 um), the dispersibility of the metal powder becomes poor, so that the metal powder is hardly conveyed. Therefore, the application of the submicron order metal powder in 3D printing manufacturing is limited. The question of how to obtain the metal powder suitable for 3D printing manufacturing is one of the critical problems in 3D printing technology.

SUMMARY OF THE INVENTION

In order to overcome the deficiencies in the prior art, the invention provides the metal powder for 3D printers, wherein the metal powder not only has various advantages of submicron particles, but also has dispersibility and conveying property of atomized metal powder.

In order to solve the technical problems, according to the technical scheme provided by the invention, the metal powder for 3D printers is submicron order metal powder with the average grain size of 0.1-3 microns through a physical vapor deposition method or a chemical vapor deposition method first, wherein the average grain size of the obtained submicron order metal powder is 0.1-3 microns; the submicron order metal powder with the average grain size of 0.1-3 microns is agglomerated to form the metal powder for the 3D printer with the average grain size of 10-50 microns.

The metal powder for 3D printers provided by the invention can be pure metal powder or alloy powder in type.

The invention further provides a preparation method for the metal powder for 3D printers, characterized by comprising the specific steps of:

(1) firstly preparing the submicron order metal powder through the physical vapor deposition method or the chemical vapor deposition method, wherein the average grain size of the submicron order metal powder is 0.1-3 microns;

(2) mixing the submicron order metal powder with the average grain size of 0.1-3 microns obtained in the step (1) with a liquid to prepare metal powder slurry, wherein the weight ratio (that is the solid-liquid weight ratio) of the submicron order metal powder liquid of the metal powder slurry is (0.25-2.0): 1;

(3) adding an organic adhesive which accounts for 0.1-10% by weight of the submicron order metal powder (solid) into the metal powder slurry obtained in step (2), and uniformly stirring and mixing the slurry;

and (4) preparing the uniformly stirred and mixed slurry in step (3) to the spherical metal powder for 3D printers with the average grain size of 10-50 microns through a centrifugal spray granulator (the centrifugal spray is also called a centrifugal granulating spraying drier) or a pressure spray granulator (the pressure spray granulator is also called a pressure spray drying granulator).

The average diameter of the metal powder for 3D printer in step (4) can be obtained by adjusting the rotating speed of centrifugal spray or the pressure of pressure spray and other control parameters as well as the solid-liquid ratio of the shiny and etc. so as to obtain the required metal powder size; in order to obtain the product with the grain size, the rotating speed of the centrifugal spray granulator in step (4) is controlled at 10000-40000 r/m; the pressure of the pressure spray granulator is 6-30 kg/cm$^2$ (that is 0.6-3 MPa); the process parameters, that is operating parameters (operating parameters suitable for the pressure spray granulator and the centrifugal spray granulator), associated with the two granulators can be controlled as follows: the inlet temperature of dry air is 200-350° C. and the outlet temperature of the dry air is 80-150° C.; the flow of the dry air is 100-300 Nm$^3$/h (standard volume per hour is the volume flow in a standard condition); the feeding speed of the metal powder slurry in the pressure spray granulator or the centrifugal spray granulator is 5-20 kg/h.

Preferably, the average grain size of the submicron order metal powder in step (1) is 0.5-2 microns. By adopting the metal powder with the grain size, an agglomeration process of a granulating process is further performed, and agglomeration among the submicron order metal powder is further facilitated, so that the metal powder is more stable in structure.

Preferably, the average grain size of the metal powder for 3D printers in step (4) is 20-30 microns. By using the metal powder in this grain size range, application of the metal powder in 3D printers is further facilitated.

Preferably, the metal powder provided by the invention can be pure metal powder of titanium, nickel, copper etc., or can be nickel-based alloy powder, for example, NiCr21Fe18Mo9, NiCr19Nb5Mo3 etc.; titanium-based alloy powder, for example, Ti6Al4V; aluminium-based alloy powder, for example, Al—Si10Mg, AlSi12 etc.; iron-based alloy powder, for example, GPI-stainless steel, 316L etc. as well as other metal powders for 3D printing, for example, Co28Cr6Mo and CoCr-2LC.

The liquid in step (2) can be water, ethanol or other organic solutions (for example, isopropanol, methanol etc.).

The organic adhesive provided by the invention is polyvinyl alcohol, ethyl cellulose or a special metal mineral powder granulating binder etc. (for example, a metallurgical mineral powder pellet adhesive produced by Baoding Jingsu Biotechnology Co., Ltd. with the model number of HY-1, a slag powder pellet adhesive with the model number of G-S etc.)

The metal powder for 3D printers provided by the invention has the following advantages and beneficial effects:

1. The metal powder for 3D printers provided by the invention is prepared by agglomerating the submicron order (the grain size is 0.1-3 microns) metal powder to the metal powder with the average grain size of 10-50 microns rather than complete integrated metal powder but is prepared from various submicron order metal powder which are bonded and agglomerated. Therefore, the metal powder for 3D printers not only has various advantages of submicron particles (for example, high degree of sphericity, uniform component and low oxygen content), but also has dispersibility and conveying property of atomized metal powder. Therefore, the problem that the submicron order metal powder is hard to disperse and convey in 3D printing is solved, so that the application of the submicron order metal powder in 3D printing technology becomes possible. By implementing the invention, the 3D printing technology is further developed.

2. The preparation method for the metal powder for 3D printers provided by the invention is a process which comprises the steps of: adding the organic adhesive which accounts for 1-5% of the metal powder shiny and preparing the metal powder slurry to the spherical metal powder, with the average diameter of 10-50 microns, through the centrifugal spray granulator, the pressure spray granulator or other granulating equipment. The average diameter of the metal powder can be obtained by adjusting the rotating speed of centrifugal spray or the pressure of pressure spray as well as the solid-liquid ratio of the slurry. Particularly, relatively small metal powder can be obtained by adjusting the solid-liquid ratio of the slurry. Through experiments in the invention, at a same rotating speed of centrifugal spray or a same pressure of pressure spray, the metal powder slurry with small solid-liquid ratio can obtain a relatively small amount of metal powder because at the same rotating speed, the liquid drops injected are equivalent in diameter. As the content of metal powder particles in the liquid drops is small, the liquid drops are dried and few metal powder particles shrink to become the metal powder with relatively small diameter. Therefore, the technical effect of preparing the metal powder with the average diameter of 10-50 microns is successfully realized by selecting a solid-liquid ratio of 0.25-2.0. By means of the granulating method, powder which is smaller than atomized metal powder can be obtained. Then the metal powder passes through a screening machine to remove non-agglomerated loose powder and ultra-large powder agglomerates so as to obtain the metal powder in the required size. The metal powder not only has various advantages of submicron particles, but also has dispersibility and conveying property of atomized metal powder, so that the submicron metal powder can be applied to existing 3D printing equipment.

DETAILED DESCRIPTION OF THE EMBODIMENT

The invention is further described in detail through the embodiments, but the invention is not limited to the embodiments.

Equipment associated with the invention, for example the pressure spray granulator or the centrifugal spray granulator etc., are marketed products. The specific working principle is as follows: a feed liquid is input through a pump to spray vaporific liquid drops which then descend in as cocurrent flow with hot air (dry air); powder grains are collected from a discharge port at the bottom of a tower, exhaust gas and fine powder are separated through a cyclone separator, the exhaust gas is extracted through an exhaust fan, the powder is collected through a powder cylinder arranged at the lower end of the cyclone separator, and a second level dedusting device can be further arranged at the outlet of the exhaust fan. The pressure, the flow and the size of spray holes are regulated according to specifications of the product, so that the required spherical particles in a certain proportion in size are obtained.

Embodiment I

Figure 1:
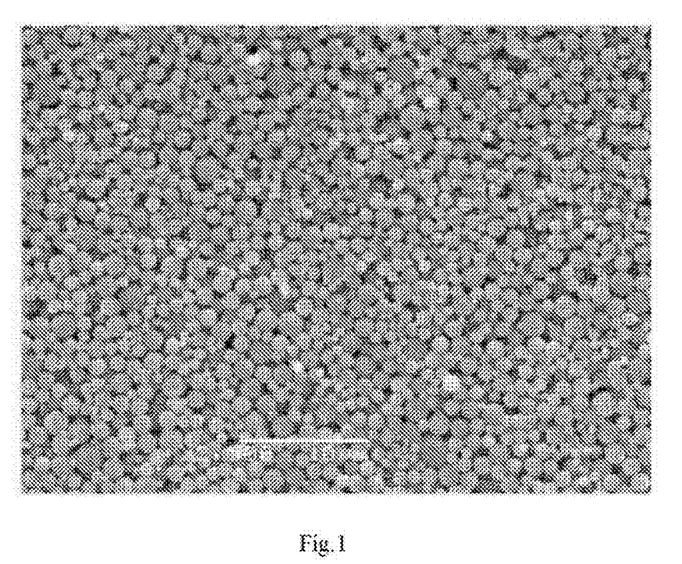
FIG. 1 is a scanning electron microscope diagram of the submicron order metal powder.
Figure 2:
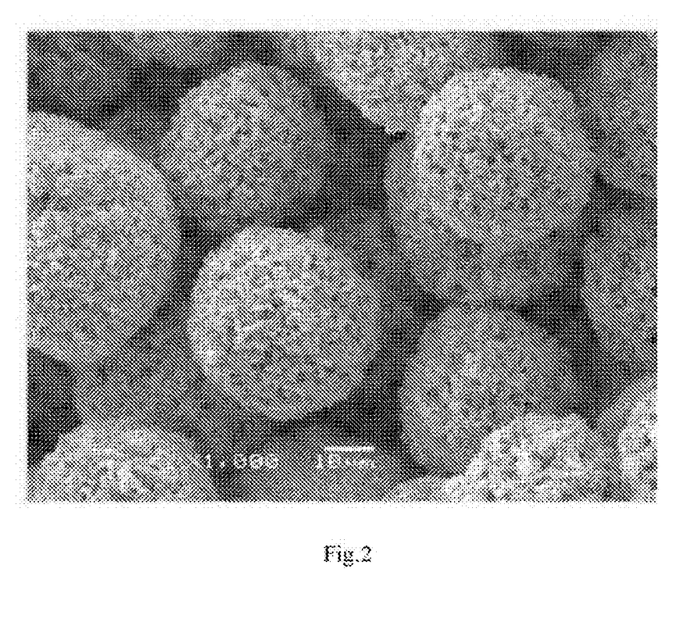
FIG. 2 is a scanning electron microscope diagram of the metal powder (I) for 3D printers.
Figure 3:
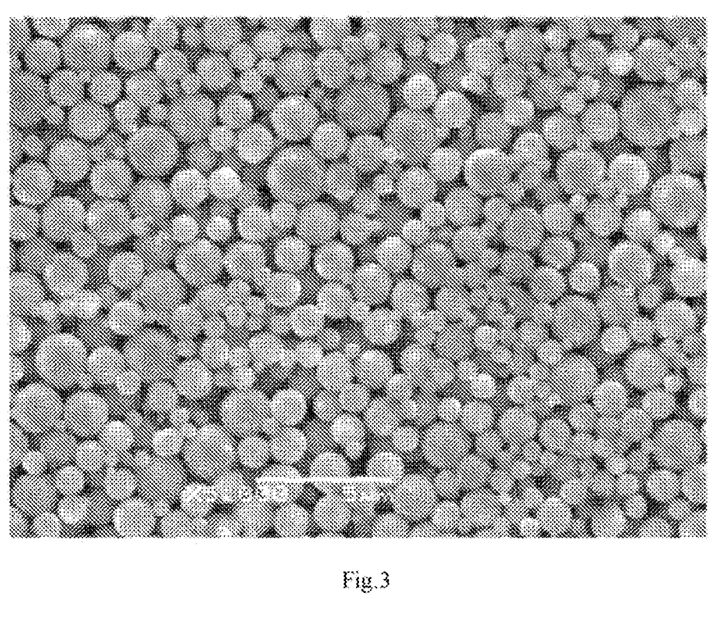
FIG. 3 is a scanning electron microscope diagram of the copper-based alloy powder with the average grain size of 1.0 micron.
Figure 4:
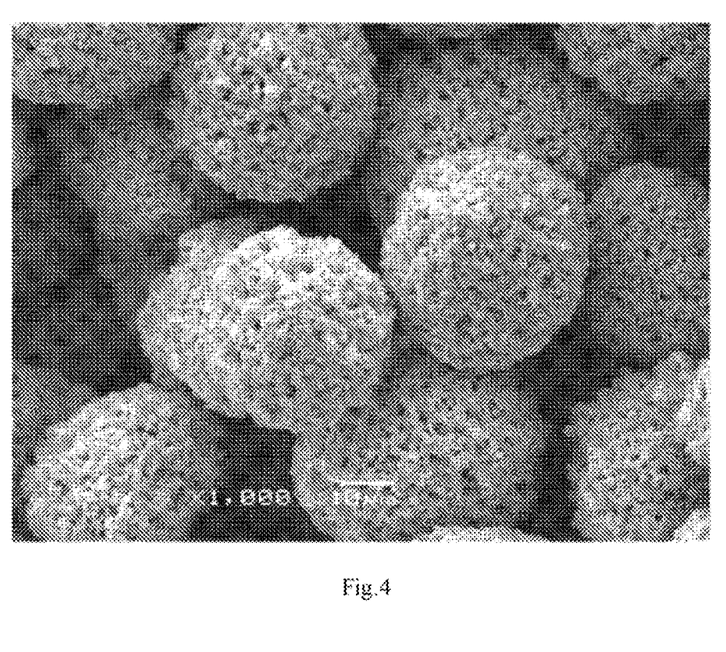
FIG. 4 is a scanning electron microscope diagram of the copper-based alloy powder with the average grain size of 40 microns.

A physical vapor deposition method is used: dissolving a copper-based alloy as a raw material in a crucible, wherein gas (hydrogen, argon, nitrogen and etc.) enters from a gas inlet pipe in a plasma transfer arc torch and is transferred into plasma through an external power supply to generate a plasma transfer arc between the crucible and the plasma transfer arc torch (i.e., the lower end of the plasma transfer arc torch generated by the plasma transfer arc torch is connected to a metal liquid level in the crucible); evaporating and vaporizing the metal through the plasma transfer arc torch; passing through a quenching pipeline by metal vapor and adding inert gas or nitrogen at room temperature into the metal vapour at a high speed to reduce the temperature of the metal vapour to be lower than 300° C. to obtain the copper-based alloy powder with the average grain size of 1.0 micron (FIG. 3) (the physical vapor deposition method is a conventional method in the industry, and is not described in detail therein); and then preparing the copper-based alloy powder and ethanol into metal powder slurry with the solid-liquid ratio of 1.5:1. The organic adhesive accounts for 2% by weight of the solid. The metal slurry is prepared into spherical metal powder through the centrifugal spray granulator. The rotating speed of the centrifugal spray granulator is controlled at 12000 r/m, the inlet temperature of dry air of the centrifugal spray granulator is 200° C. and the outlet temperature is 90° C. and the flow of the dry air is 220 Nm³/h. The feeding speed of the metal powder slurry is 12 kg/h. The dried and granulated metal powder is collected through a cyclone and ultrafine metal powder is collected through a filter bag. The metal powder collected by the cyclone is graded by a vibrating sieve to obtain a metal powder with the average grain size of 40 microns (FIG. 4). The metal powder collected by the filter bag and the metal powder which is screened and removed is recovered to prepare the metal powder slurry.

Embodiment II

Figure 5:
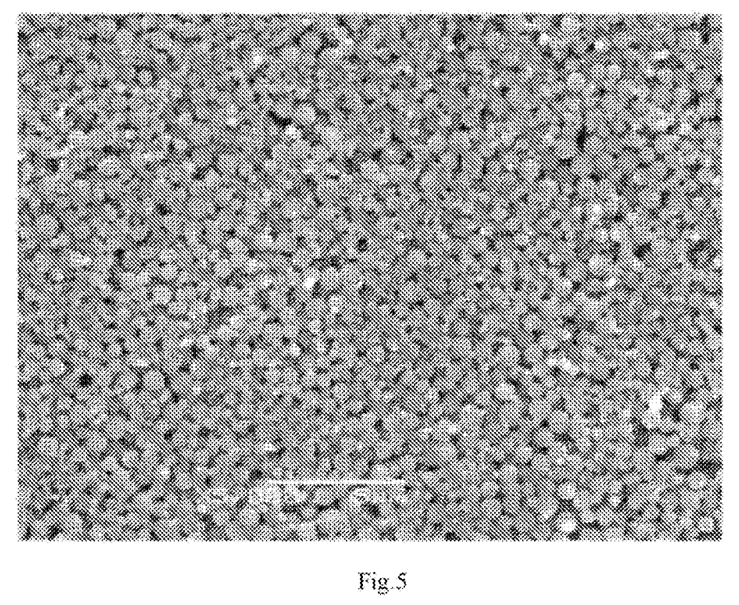
FIG. 5 is a scanning electron microscope diagram of the titanium-based alloy powder with the average grain size of 0.5 micron.
Figure 6:
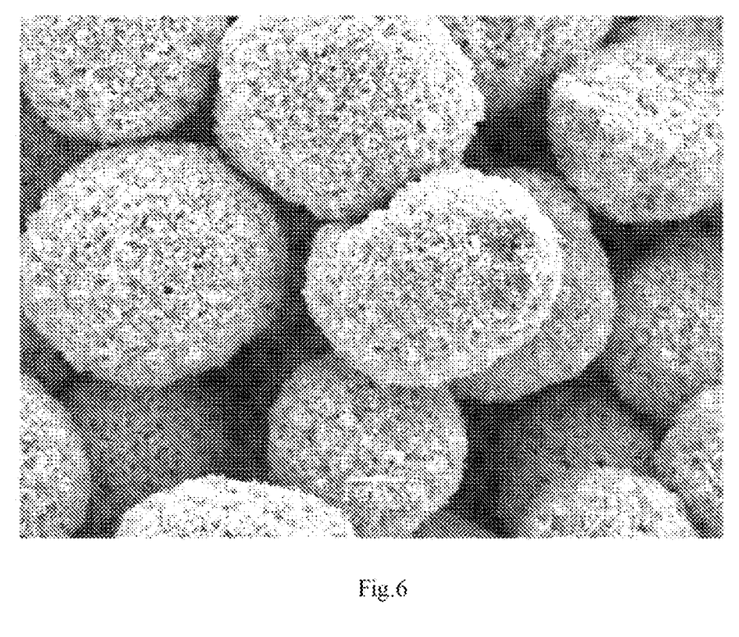
FIG. 6 is a scanning electron microscope diagram of the titanium-based alloy powder with the average grain size of 45 microns.

The titanium-based alloy powder (FIG. 5) with the average grain size of 0.5 micron produced by the physical vapor deposition method and water are prepared into the metal powder shiny with the solid liquid ratio of 2:1. The organic adhesive (ethyecellulose) accounts for 1.5% by weight of the solid. The metal slurry is prepared into spherical metal powder through the centrifugal spray granulator. The rotating speed of the centrifugal spray granulator is controlled at 12000 r/m, the inlet temperature of dry air of the centrifugal spray granulator is 350° C. and the outlet temperature is 120° C., and the flow of the dry air is 250 Nm³/h. The feeding speed of the metal powder slurry is 10 kg/h. The dried and granulated metal powder is collected through a cyclone and ultrafine metal powder is collected through a filter bag. The metal powder collected by the cyclone is graded by a vibrating sieve to obtain the metal powder with the average grain size of 45 microns (FIG. 6). The metal powder collected by the filter bag and the metal powder which is screened and removed is recovered to prepare the metal powder slurry.

Embodiment III

Figure 7:
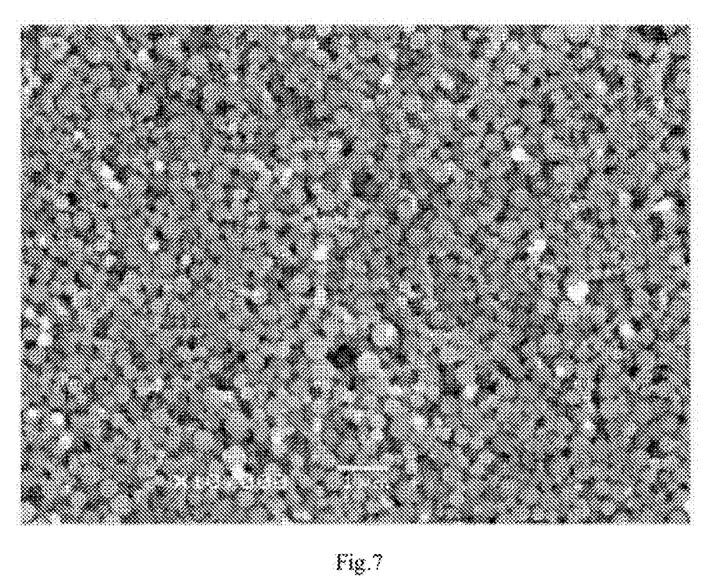
FIG. 7 is a scanning electron microscope diagram of the nickel-based alloy powder with the average grain size of 0.25 micron.
Figure 8:
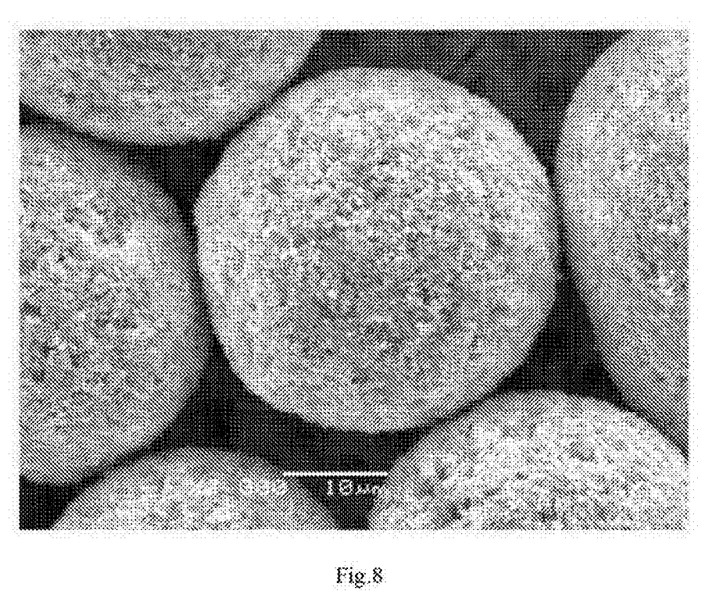
FIG. 8 is a scanning electron microscope diagram of the nickel-based alloy powder with the average grain size of 30 microns.

The nickel-based alloy powder (FIG. 7) with the average grain size of 0.25 micron produced by the physical vapor deposition method and ethanol are prepared into the metal powder slurry with the solid liquid ratio of 1:1. The organic adhesive (the metallurgical mineral powder pellet adhesive produced by Baoding Jingsu Biotechnology Co., Ltd. with the model number of HY-1) accounts for 1.5% by weight of the solid. The metal slurry is prepared into spherical metal powder through the centrifugal spray granulator. The rotating speed of the centrifugal spray granulator is controlled at 25000 r/m, the inlet temperature of dry air of the centrifugal spray granulator is 200° C. and the outlet temperature is 90° C., and the flow of the dry air is 220 Nm3/h. The feeding speed of the metal powder slurry is 10 kg/h. The dried and granulated metal powder is collected through a cyclone and ultrafine metal powder is collected through a filter bag. The metal powder collected by the cyclone is graded by a vibrating sieve to obtain the metal powder with the average grain size of 30 microns (FIG. 8). The metal powder collected by the filter bag and the metal powder which is screened and removed is recovered to prepare the metal powder slurry.

Embodiment IV

Figure 9:
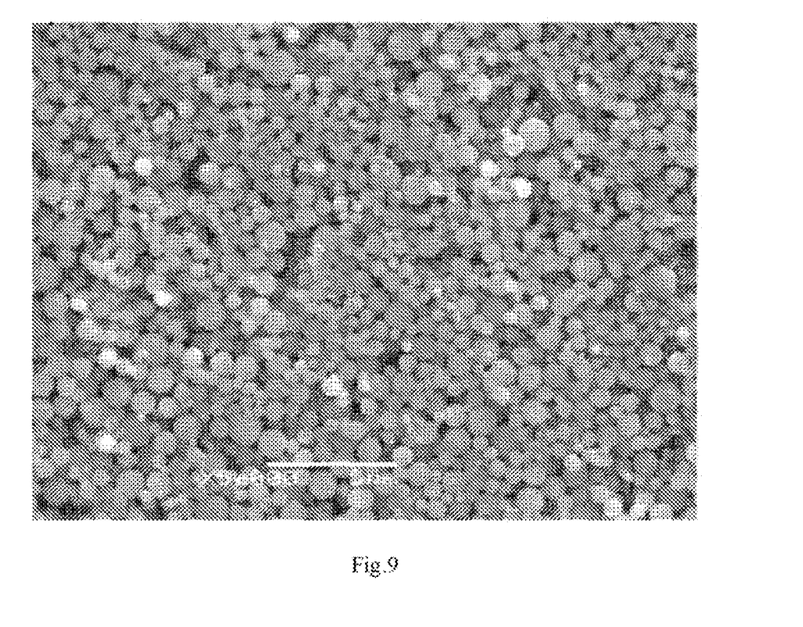
FIG. 9 is a scanning electron microscope diagram of the pure metal nickel powder with the average grain size of 0.5 micron.
Figure 10:
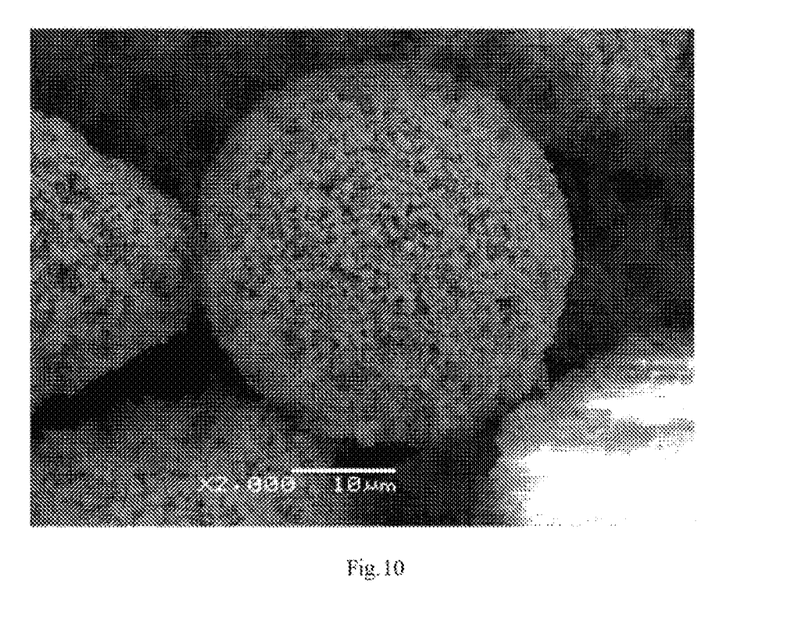
FIG. 10 is a scanning electron microscope diagram of the pure metal nickel powder with the average grain size of 40 microns.
Figure 11:
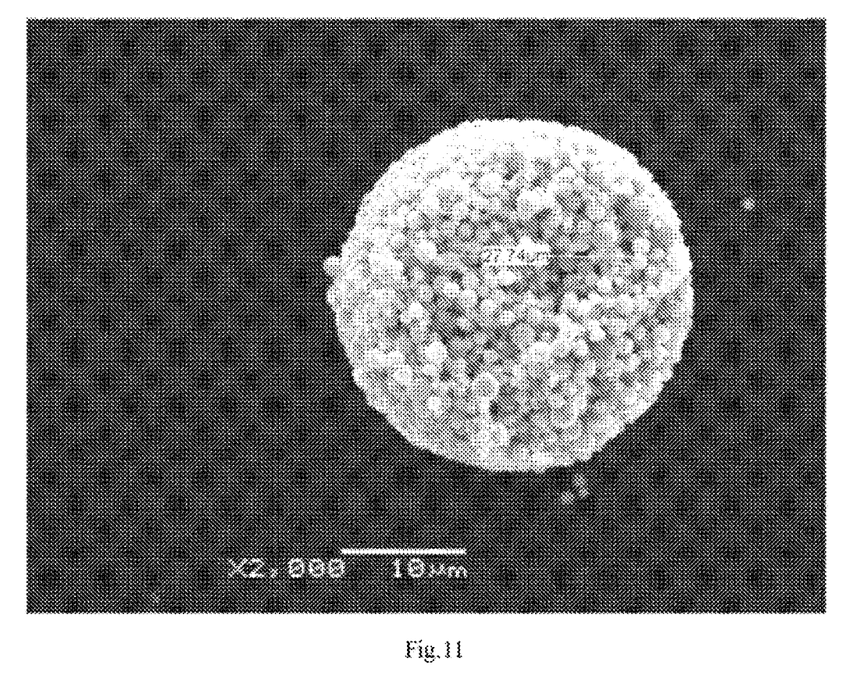
FIG. 11 is as scanning electron microscope diagram of the metal powder (II) for 3D printer.

The pure metal nickel powder (FIG. 9) with the average grain size of 0.5 micron produced by the physical vapor deposition method and methanol are prepared into the metal powder slurry with the solid liquid ratio of 1.5:1. The organic adhesive accounts for 1.0% by weight of the solid. The metal slurry is prepared into spherical metal powder through the pressure spray granulator. The pressure of the pressure spray is controlled at 15 kg/cm², the inlet temperature of dry air is 250° C. and the outlet temperature is 95° C., and the flow of the dry air is 250° C. The feeding speed of the metal powder slurry is 12 kg/h. The dried and granulated metal powder is collected through as cyclone and ultrafine metal powder is collected through a filter bag. The metal powder collected by the cyclone is graded by a vibrating sieve to obtain the metal powder with the average grain size of 40 microns (FIG. 10). The metal powder collected by the filter bag and the metal powder which is screened and removed is recovered to prepare the metal powder slurry.

It can be known from the drawings that the structure of the metal powder for 3D printers prepared by means of the embodiments is not complete integrated metal powder but is formed by adhering and agglomerating multiple submicron order metal powder, so that the metal powder for 3D printers not only has various advantages of the submicron particles (for example, high degree of sphericity, uniform component and low oxygen content), but also has dispersibility and conveying property of the atomized metal powder.

The metal powder for 3D printers prepared by the embodiments is used for 3D printing. The metal powder for 3D printers is sprayed to as heating mould working platform in a protective room with protective gas to be printed layer by layer through a nozzle of the 3D printers so as to form a 3D printing product; in the spraying process by the nozzle, the metal powder has the advantages that the metal powder is good in dispersibility and is smoothly conveyed; in the process of printing layer by layer, the contact area of the metal powder in each layer at the connected part is fully increased, and the metal powder is firmly adhered.

The invention claimed is:

1. A preparation method for the metal powder for 3D printer, comprising the specific steps of:
    (1) firstly preparing the submicron order metal powder through the physical vapor deposition method or the chemical vapor deposition method, wherein the average grain size of the submicron order metal powder is 0.1-3 microns;
    (2) mixing the submicron order metal powder with the average gain size of 0.1-3 microns obtained in step (1) with a liquid to prepare metal powder slurry, wherein the weight ratio of the submicron order metal powder liquid of the metal powder slurry is (0.25-2.0): 1;
    (3) adding an organic adhesive which accounts for 0.1-10% by weight of the submicron order metal powder into the metal powder slurry obtained in step (2), and uniformly stirring and mixing the slurry;

and (4) preparing the uniformly stirred and mixed slurry in step (3) to the spherical metal powder for 3D printers with the average grain size of 10-50 microns through a centrifugal spray granulator or a pressure spray granulator.

2. The preparation method for the metal powder for 3D printers according to claim 1, wherein the average grain size of the submicron order metal powder in step (1) is 0.5-2 microns.

3. The preparation method for the metal powder for 3D printers according to claim 2, wherein the average grain size of the metal powder for 3D printers in step (4) is 20-30 microns.

4. The preparation method for the metal powder for 3D printers according to claim 1, wherein the metal powder is pure metal powder of titanium, nickel or copper or alloy powder of nickel-based alloy powder, titanium-based alloy powder, aluminium-based alloy powder or iron-base alloy.

5. The preparation method for the metal powder for 3D printers according to claim 1, wherein the liquid in step (1) is water, ethanol, isopropanol or methanol.

6. The preparation method for the metal powder for 3D printers according to claim 1, wherein the organic adhesive in the step (3) is a polyvinyl alcohol adhesive, or an ethyl cellulose adhesive.

7. The preparation method for the metal powder for 3D printers according to claim 1, wherein the rotating speed of the centrifugal spray granulator in step (4) is controlled at 10000-40000 r/m; the pressure of the pressure spray granulator is 6-30 $kg/cm^2$; other operating parameters of the pressure spray granulator or the centrifugal spray granulator are controlled as follows: the inlet temperature of dry air is 200-350° C. and the outlet temperature is 80-150° C.; the flow of the dry air is 100-300 $Nm^3/h$; the feeding speed of the metal powder slurry in the pressure spray granulator or the centrifugal spray granulator is 5-20 kg/h.

* * * * *